United States Patent
Gao

(10) Patent No.: US 10,912,230 B1
(45) Date of Patent: Feb. 2, 2021

(54) HYBRID MULTI-FUNCTION DOOR DESIGN FOR ELECTRONIC RACKS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/578,273

(22) Filed: Sep. 20, 2019

(51) Int. Cl.
*H05K 7/20* (2006.01)
*H05K 7/18* (2006.01)
*H05K 7/14* (2006.01)

(52) U.S. Cl.
CPC ....... *H05K 7/20836* (2013.01); *H05K 7/1487* (2013.01); *H05K 7/18* (2013.01)

(58) Field of Classification Search
None
See application file for complete search history.

(56) References Cited

U.S. PATENT DOCUMENTS

| | | | |
|---|---|---|---|
| 2012/0120603 A1* | 5/2012 | Campbell | H05K 7/20836 361/698 |
| 2014/0133099 A1* | 5/2014 | Campbell | H05K 7/20781 361/698 |
| 2016/0356558 A1* | 12/2016 | Franz | F28F 9/0202 |

* cited by examiner

*Primary Examiner* — Mukundbhai G Patel
(74) *Attorney, Agent, or Firm* — Womble Bond Dickinson (US) LLP

(57) ABSTRACT

Hybrid multi-function rack door designs are disclosed. A rack includes a housing cabinet and rack door. The housing supports a plurality of servers or information technology (IT) equipment. The rack door is coupled to the housing and includes a rack manifold and a heat exchanger. The rack manifold supplies a cooling liquid to the rack door and extracts a cooling liquid from the rack door. The heat exchanger cools air from the blade servers, and the rack manifold is integrated into the heat exchanger as part of the rack door. The rack door can have the rack manifold in a fixed position and the heat exchanged configured to pivot away from the rack manifold in an open or partially open position. The rack door can be designed as one part of the data center cooling infrastructure, and commissioned together.

18 Claims, 11 Drawing Sheets

HYBRID MULTI-FUNCTION DOOR DESIGN FOR ELECTRONIC RACKS

FIELD

Embodiments of the invention relate generally to thermal management and cooling hardware for information technology (IT) racks. More particularly, embodiments of the invention relate to a hybrid multi-function door design for IT racks.

BACKGROUND

Data centers are common place for housing large groups of networked servers, typically used by enterprises or organizations for remote storage, processing, or distribution of large amounts of data. Data centers can house thousands of servers in IT racks that require exorbitant amounts of power and thus generate substantial amounts of heat. IT racks can include any number of rows or spaces to house any number of servers. For some data centers, there can be hundreds of IT racks with housing thousands of servers, which require operating within strict temperature parameters so that the servers are not damaged from overheating.

A technique to reduce heat in IT racks is the use of a rear door heat exchanger (RDHX), which resembles an automobile radiator, and is placed in the airflow outlet of the IT rack. In operation, heated air generated from the servers is pushed through the MAIN using fans and heat is exchanged from hot air to water circulating in the RDHX provided by a rack manifold. The rack manifold is typically a separate unit attached to a side of the IT rack and are shipped together and thus tested together. A disadvantage of such a configuration is complex integration because the entire IT rack with the manifold needs to be connected to the water supply loop for verification tests. In addition, the RDHX solution is not compatible with most liquid cooling systems due to structural design limitations.

BRIEF DESCRIPTION OF THE DRAWINGS

The appended drawings illustrate examples and embodiments and are, therefore, exemplary and not considered to be limiting in scope.

DETAILED DESCRIPTION

Figure 1:
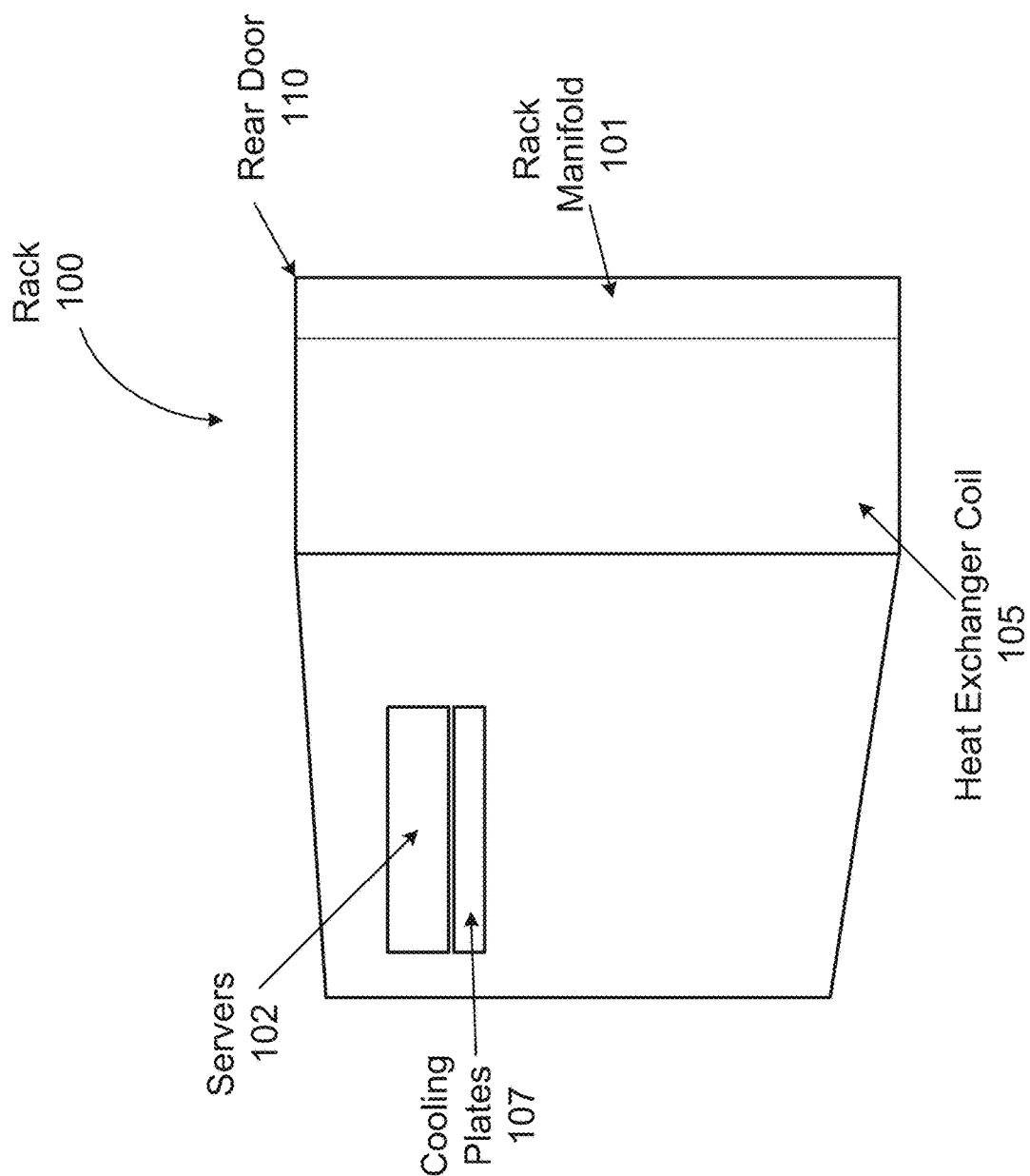
FIG. 1 illustrates a rack with a rear door having a hybrid multi-function design according to one embodiment.

As set forth in the detailed description, various embodiments, examples and aspects will be described with reference to details discussed below, and the accompanying drawings will illustrate various embodiments and examples. The following description and drawings are illustrative and are not to be considered as limiting. Numerous specific details are described to provide a thorough understanding of various embodiments and examples. However, in certain instances, well-known or conventional details are not described to facilitate a concise discussion of the embodiments and examples.

Reference in the detailed description to "one embodiment" or "one example" means that a particular feature, structure, or characteristic described in conjunction with the embodiment or example can be included in at least one embodiment or example of the disclosure. The appearances of the phrase "in one embodiment" or "in one example" in various places in the detailed description do not necessarily refer to the same embodiment or example. Although the following embodiments or examples refer to rack doors, the embodiments and examples can be implemented for any type of door providing liquid cooling management.

Embodiments and examples are disclosed for an innovative rack door design that integrates a rack manifold and a heat exchanger coil as part of the rack door, e.g., a rear rack door. Such a rack door design introduces a hybrid multi-function rack door providing an innovative rack cooling configuration that implements a rear door heat exchange and liquid cooling system for servers housed in a rack. In this way, a rear rack door provides multiple function such as rear door exchange cooling and manifold functions such as distributing a cooling liquid for the rack. This allows for a simple deployment and on-side installation of racks for data centers. For example, RDHX solutions and liquid cooling solutions can be combined and compatible with each other such that they are integrated into one solution.

According to one embodiment, a rack includes a housing and rack door coupled to the housing. The housing supports a plurality of blade servers. The rack door includes a rack manifold and a heat exchanger integrated into the rack door. The rack manifold supplies cooling liquid to the servers. The heat exchanger cools air from the blade servers using the cooling liquid. For one embodiment, the rack manifold is fixedly positioned and the heat exchanger can pivot from the rack manifold in an open or partially open position.

For one embodiment, cold plates are thermally coupled to the blade servers and to circulate a cooling liquid from the rack manifold in a loop around the blade servers. For other embodiments, the cold plates are part of the blade servers. The rack manifold includes inlet and output ports to receive and exit cooling liquid to and from the rack door. The rack manifold also includes supply and return ports to distribute cooling liquid to the heat exchanger and cooling plates. The supply and return ports can include dripless blind mate connectors. The inlet and output ports of the rack manifold can be coupled to a cooling distribution unit (CDU).

According to one embodiment, a cooling method includes supplying cooling liquid to an inlet port of a rear door. The cooling liquid is distributed from the rear door inlet port to a heat exchanger coil or rack manifold supply port to provide cooling liquid to a server cooling loop of a rack, wherein the rack manifold is integrated with the heat exchange coil to the rear door. The cooling liquid returns from server cooling loop or heat exchanger coil to an outlet port of the rear door. For one embodiment, the cooling liquid is distributed to the heat exchanger coil first that returns to the rack manifold and supplies the server cooling loop with cooling liquid. For another embodiment, the cooling liquid is distributed to the rack manifold first that is distributed to the server cooling loop and returns to the heat exchanger coil. For still another embodiment, the cooling liquid is distributed together to both the heat exchanger coil and rack manifold returns the cooling liquid to the rear door outlet port.

According to one embodiment, a method for rack testing includes installing a rear door to a rack. The rear door has an integrated heat exchanger coil and rack manifold. The heat exchanger coil and rack manifold are tested and commissioned together with the data center cooling loop. After installing the rear door on the rack, a server cooling loop can be tested for the rack.

FIG. 1 illustrates a rack 100 having a rear door 110 with a hybrid multi-function design according to one embodiment. Rack 100 can house a plurality of servers 102 (e.g., blade servers) and cooling plates 107 thermally coupled to servers 102 or part of servers 102. For one embodiment, rear door 110 is attached to the back end of rack 100 implementing a hybrid door design by integrating heat exchanger coil 105 with a rack manifold 101 thus providing heat exchanging functions as well as cooling liquid or fluid (e.g., water) distribution functions for rack 100. For example, a function provided by rear door 110 is to cool hot exhaust air from the servers 102 using the heat exchanger coil 105 that uses cooling liquid flowing in heat exchanger coil 105 provided by rack manifold 101. Another function provided by rear door 110 is to distribute cooling liquid to heat exchanger coil 105 and rack 100 including cooling plates 107 thermally coupled to servers 102 to form a server cooling loop. For one embodiment, rack manifold 101 is coupled to a cooling distribution unit (CDU) to provide the cooling liquid or water that is distributed within rack 100 including the rear door 110.

For one embodiment, hot exhaust air from servers 102 is blown around the heat exchanger coil 105 flowing with cooling liquid. Heat from the hot air is thus transferred to the cooling fluid in the coils which is returned to the rack manifold 101 that exits the cooling liquid from the rear door 110. For one embodiment, rack manifold 101 distributes cooling liquid to cooling plates 107 that are thermally coupled to servers 101 and exchange heat from servers 101 to the cooling liquid flowing in the cooling plates 107. The cooling liquid from the cooling plates 107 can return to the rack manifold 101 that exits the cooling liquid out from the rear door 110 thus forming a server cooling loop. In this way, rear door 110 implements a hybrid multi-function rack door design. For another embodiment, rear door 110 with integrated rack manifold 101 and heat exchanger coil 105 is easily detachable and attachable to the rack 100.

Figure 2:
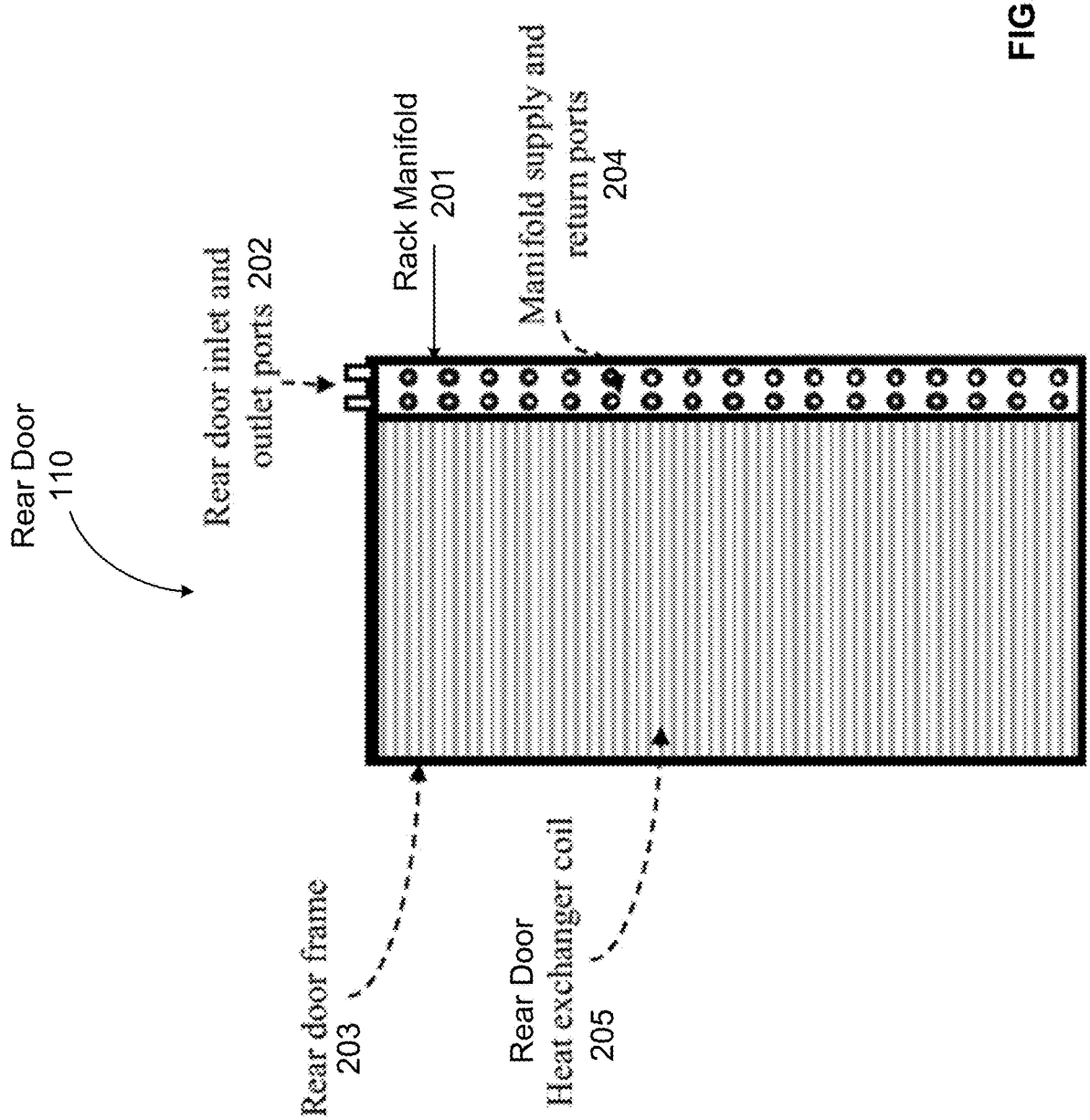
FIG. 2 illustrates the rear door of FIG. 1 with a hybrid multi-function design according to one embodiment.

FIG. 2 illustrates the rear door 110 of FIG. 1 with a hybrid multi-function design according to one embodiment. For one embodiment, rear door 110 includes a rack manifold 201 integrated into the rear door frame 203. A rear door heat exchanger coil 205 is attached to the rear door frame 203. For one embodiment, rear door heat exchanger coil 205 is a liquid to air heat exchanger in which a cooling liquid flows in the coil 205 and exchanges heat with hot exhaust from servers 102 and the cooling liquid in the coil 205. The coil 205 is coupled to rack manifold 201 distributing the cooling liquid. For one embodiment, rear door 110 is assembled as a separate unit and can be attached to rack 100 as a rack door after installation in a data center.

For one embodiment, rack manifold 201 includes rear door inlet and outlet ports 202 connected to an internal or external cooling liquid source such as a cooling liquid distribution unit (CDU) that supplies a cooling liquid (e.g., water) and allows the cooling liquid to exit the rack 100 by way of rear door 110. For example, inlet and outlet ports 202 can be connected to a system water loop such as a secondary water loop from the CDU. For one embodiment, rack manifold 201 can distribute cooling liquid to rack 100 by way of manifold supply and return ports 204. As shown in FIG. 2, manifold 201 includes an array of pairs of supply and return ports disposed thereon. Each pair corresponds to one of the server slots of an electronic rack. When a server blade is inserted into a sever slot, the server cooling loop (e.g., cold plates) is coupled to the corresponding supply and return ports of manifold 201, for example, using dripless bind mate connectors.

For example, manifold 201 can distribute cooling liquid to the rear door heat exchanger coil 205 and cooling plates 107 in rack 100 to cool servers 101 in which the cooling liquid flows in a server loop around the rack 100. By integrating the manifold 201 into the rear door frame 203, the rear door 110 can act as both a heat exchanger to cool hot air exhaust from the blade servers 101 and a distribution point for supplying and exiting cooling liquid to and from rack 100. The cooled hot air by the rear door heat exchanger coil 205 can return back to the room or area containing the rack 100.

For one embodiment, manifold supply and return ports 204 include male or female connectors, which can include dripless blind mate connectors. Any number of manifold supply and return ports 204 can be used for rear door 110. For one embodiment, once blade servers 101 are installed on rack 100, connectors to cooling plates 107 thermally coupled to servers 101 can be immediately connected to manifold supply and return ports 204 connectors. In this way, a cooling liquid loop can be generated within rack 100 and manifold 201. For other embodiments, although not shown, rear door 110 can include devices such as, e.g., an air bleeding valve, fluid valve, sensors, and a control module.

Figure 3:
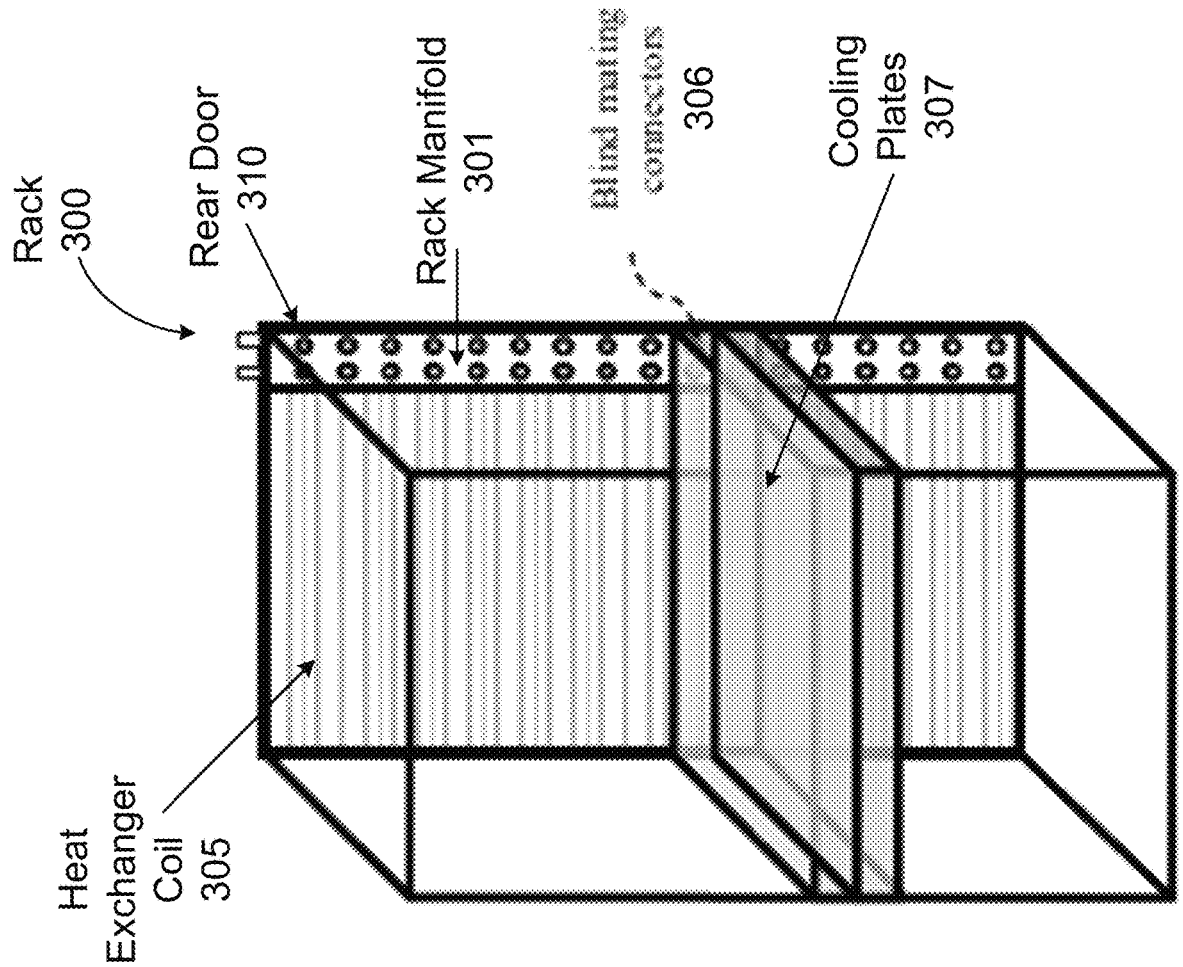
FIG. 3 illustrates a rack assembled with a rear door as a rack unit having hybrid multi-functions according to one embodiment.

FIG. 3 illustrates a rack 300 assembled with a rear door 310 as a rack unit having hybrid multi-functions according to one embodiment. Referring to FIG. 3, a front view of rack 300 is shown aligned with the rear door 310 such that servers can be installed from the front and placed on cooling racks 307 at right angles with rear door 310. For one embodiment, rear door 310 is assembled with rack 300 as a unit or, alternatively, the rear door 310 can be attached to rack 300 at the data center in which the rack 300 is installed first. For one embodiment, blind mating connectors 306 can be coupled to cooling plates 307. For other embodiments, cooling plates 307 can be part of the servers in which blind mating connectors 306 are coupled to the servers.

For one embodiment, rear door 310 is configured with a heat exchanger coil 305 integrated with a rack manifold 301. Rack manifold 310 can connect the blind mating connectors 306 to inlet and output ports which can be connected to a CDU. For this example, rear door 310 can be situated on any side of rack 300 adjacent to openings in rack 300 to receive servers. For example, rear door 310 can be easily detached and reattached to rack 300 at any side depending on the location of connection ports for cooling plates 307.

Figure 4A:
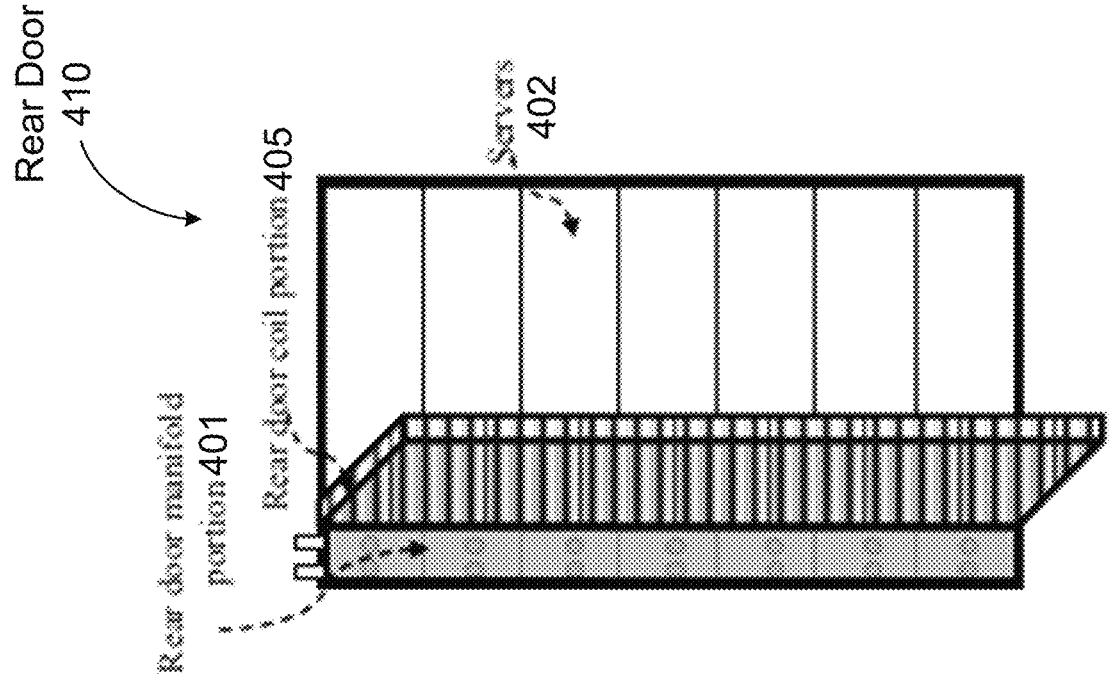
FIGS. 4A-4B illustrates other rear door configurations for the rack of FIG. 3 according to one embodiment.
Figure 4B:
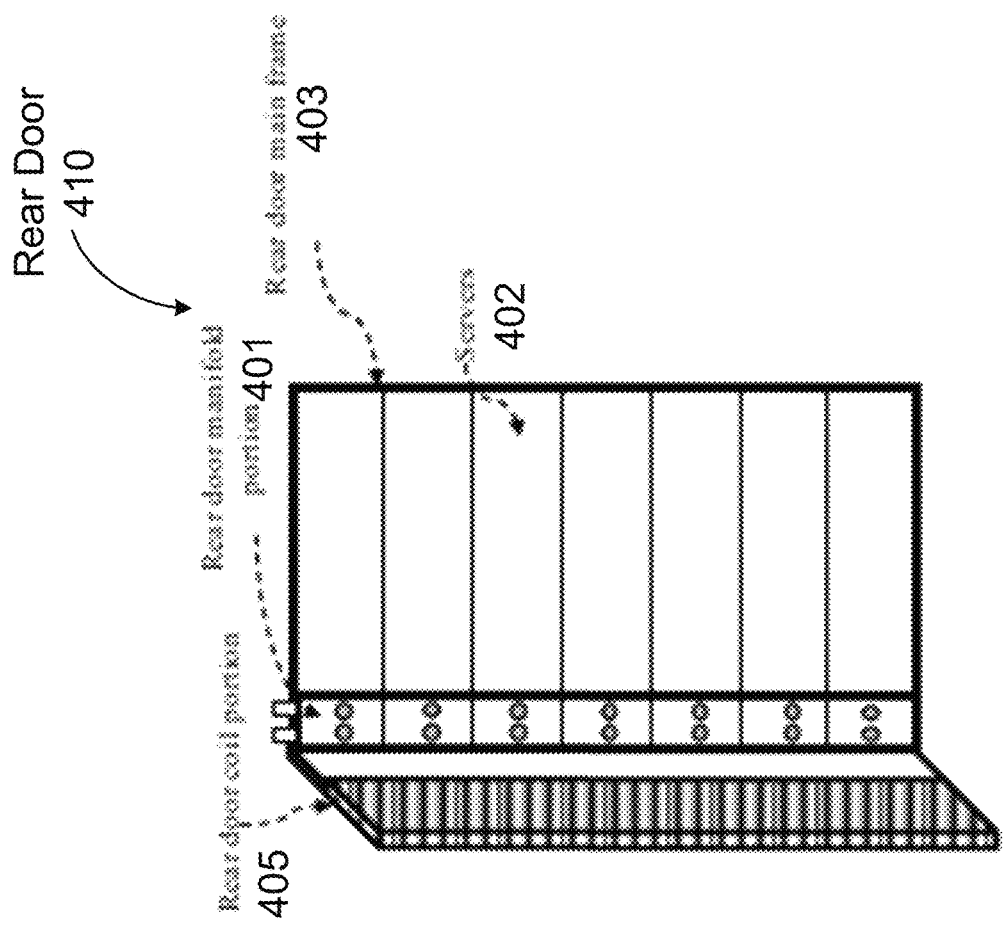

FIGS. 4A-4B illustrates other rear door configurations for the rack 300 of FIG. 3 according to one embodiment. Referring to FIG. 4A, rear door 410 includes a rear door coil portion 405 integrated into and attached with rear door manifold portion 401. In this example, the rear door manifold portion 401 is fixed such that rear door coil portion 405 can pivot away from rear door manifold portion 401 into a partially open position exposing servers 402. By being at least partially open, rear door coil portion 405 can have maintenance performed such as fixing broken or replacing malfunctioning components. That is, rear door 410 needs to be open when servicing is needed from the rear side of rack or servicing is needed for the rear door coil portion 405 or rear door manifold portion 401 including connectors. In addition, rear door manifold portion 401 is also assessable in this design. For one embodiment, cooling of the rack can be partially maintained or fully maintained even when rear door 410 is open.

Referring to FIG. 4B, rear door 410 is fully open exposing the entire rear door main frame 403 and servers 402. In this example, rear door manifold portion 401 is fixed while the rear door coil portion 405 pivots in a fully open position. The rear door 410 design examples of FIGS. 4A-4B ensure and allow the liquid cooling system to operation by way of rear door manifold portion 401 to function while allowing maintenance service to the rack and the manifold by an opened rear door 410. In this way, cooling liquid is distributed to the rack in which air cooling can be shared by adjacent racks while servicing the rack with an open rear door 410. For one embodiment, if rear door manifold portion 401 and servers 402 are not assembled with blind mate connectors, the server side connectors can be connected to rear door manifold portion 401 manually.

Figure 5A:
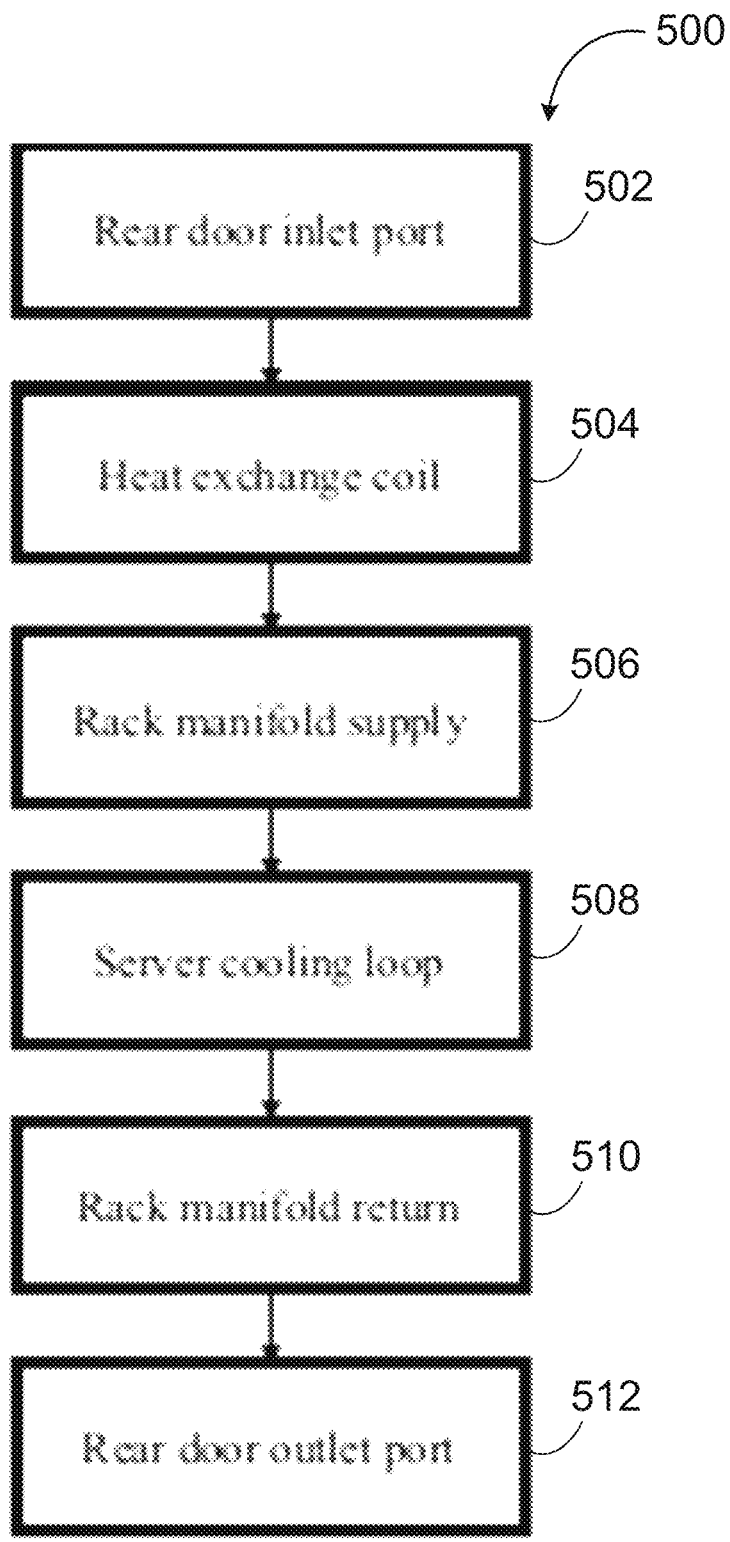
FIGS. 5A-5C illustrates process flows for a cooling liquid flowing through a rack using a hybrid multi-function rack door.
Figure 5B:
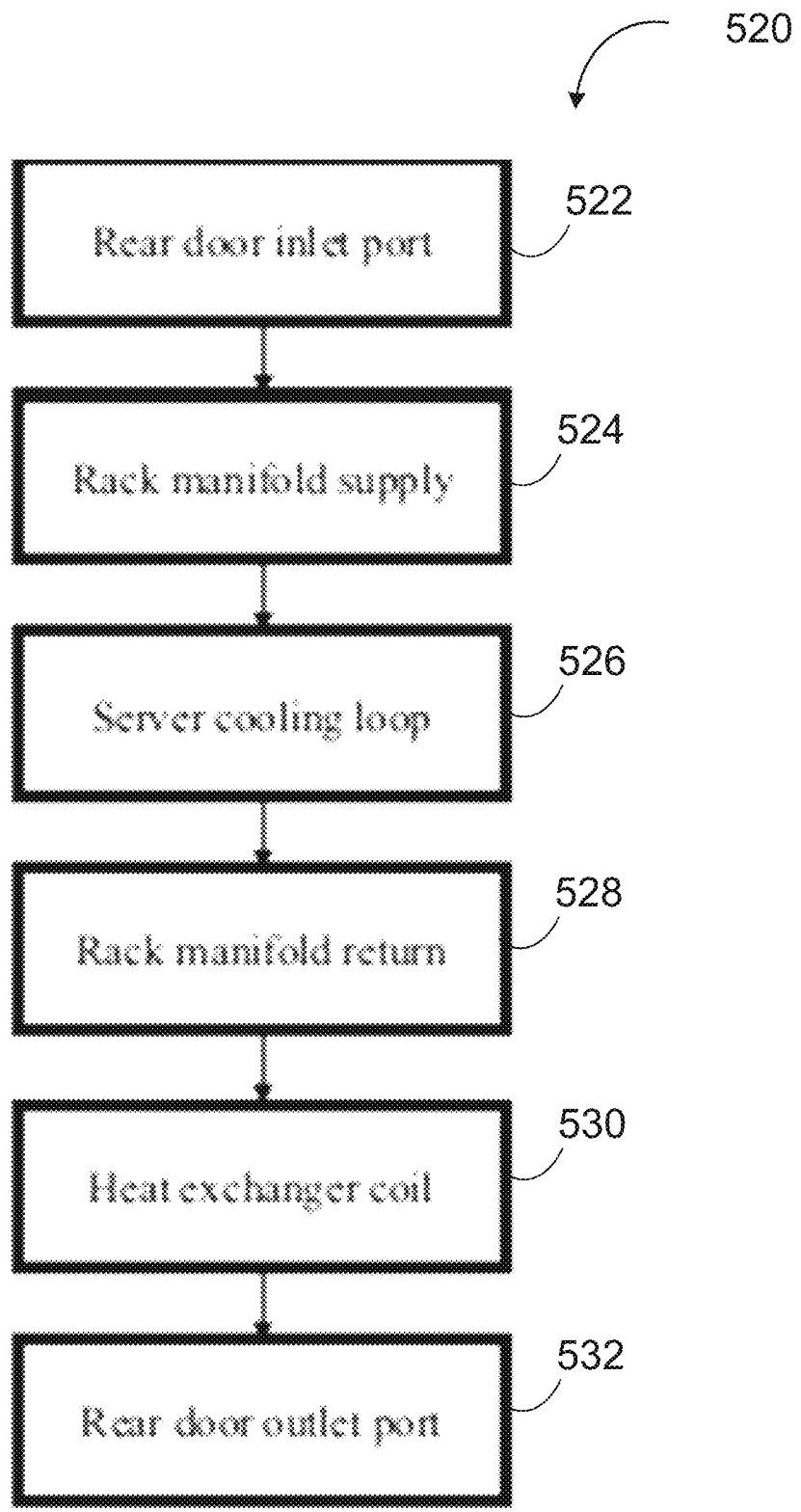
Figure 5C:
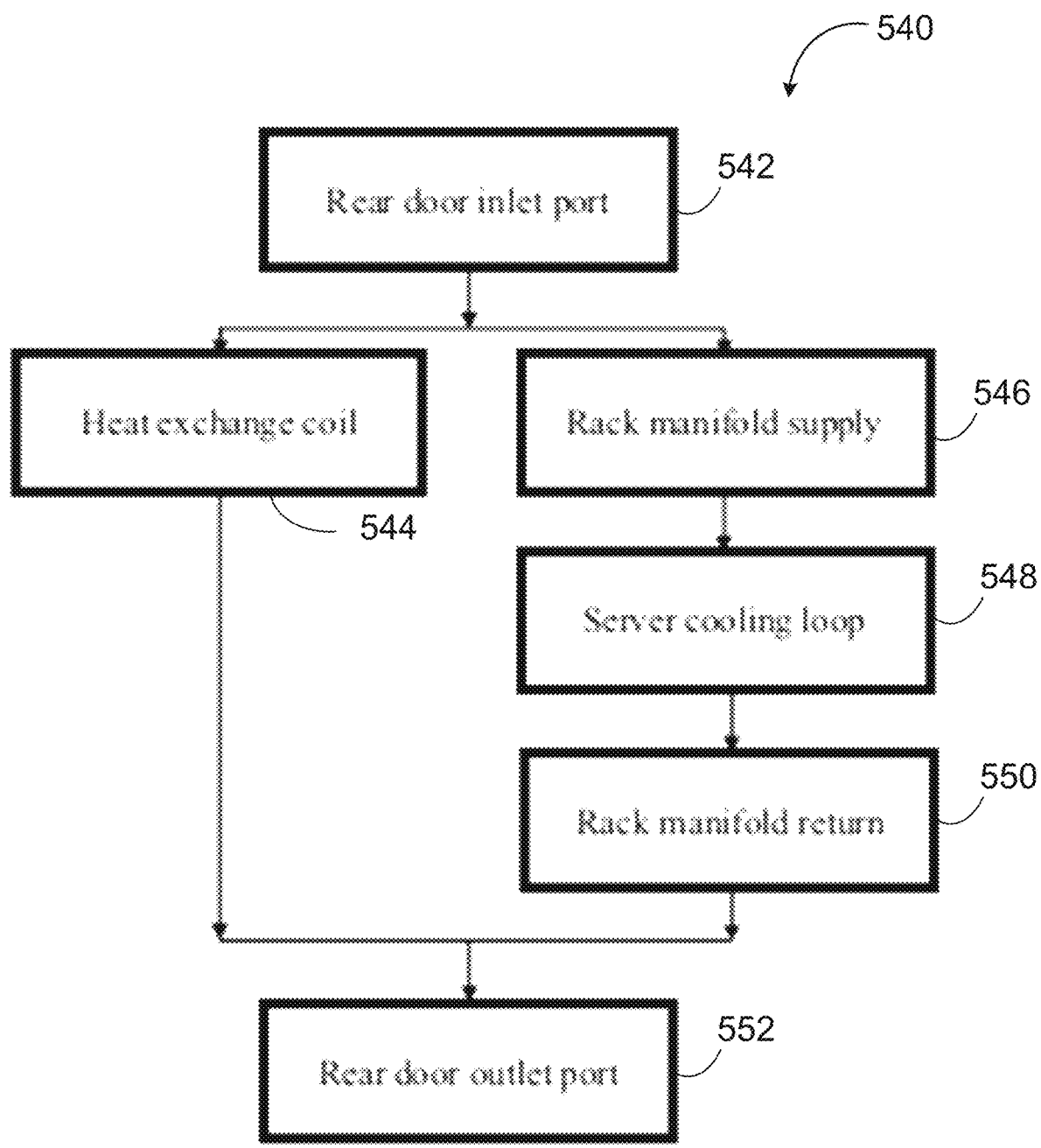

FIGS. 5A-5C illustrates process flows 500, 520 and 540 for a cooling liquid flowing through a rack using a hybrid multi-function rack door. For example, the process flows 500, 520 and 540 can be implemented for internal liquid or fluid (e.g., water) flow through rack and rack door as shown in FIGS. 1-4B. Referring to FIG. 5A, the process flow 500 includes processing operations 502 to 512. At block 502, a cooling liquid enters a rear door inlet port. At block 504, the cooling liquid entering the rear door inlet port is distributed and goes to the heat exchange coil first. For this embodiment, the inlet port can be connected to the rack manifold and, in another embodiment, the inlet port can be connected to the heat exchanger. In the case of an inlet port connected to the rack manifold, the rack manifold will have a direct connection the heat exchanger coil inlet and outlet.

At block 506, the cooling liquid from the heat exchanger enters the rack manifold supply port. At block 508, the cooling liquid from the rack manifold supply port flows through the server cooling loop. This flow can pass cooling liquid through cooling plates thermally coupled to blade servers. At block 510, the cooling liquid flowing through the server cooling loop flows to the rack manifold return port. At block 512, the cooling liquid from the rack manifold return port passes to the rear door outlet port and out of the rack door.

For this design implementation, as described by FIG. 5A, a cooling liquid flows the heat exchange coil first and then back to the rack manifold which distribute the cooling liquid through the manifold supply ports to the server cooling loop. The cooling liquid from the server cooling loop returns back to the rack manifold through the manifold return ports and eventually exits that rear door through rear door outlet port. In this design, for one embodiment, the coil contains lower temperature water than the one supplied to the server.

Referring to FIG. 5B, the process flow 520 includes processing operations 522 to 532. At block 522, a cooling liquid (e.g., water) enters a rear door inlet port. At block 524, the cooling liquid flows to the rack manifold supply port. At block 526, the cooling liquid from the rack manifold supply port flows through the server cooling loop. At block 528, the cooling liquid from the server cooling loop returns to the rack manifold. At block 530, the returning cooling liquid from the rack manifold then flows to the heat exchanger coil. At block 532, the cooling liquid from the heat exchanger coil flows to the rear door output port and exits the rear door.

For this design implementation, as described in FIG. 3B, a cooling liquid flows to the server cooling loop first and then to the heat exchanger coil before exiting the rear door. In this design, for one embodiment, the water supplied to the server loops are lower than the ones supplied to the coil.

Referring to FIG. 5C, the process flow 324 includes processing operations 542 to 552. At block 542, a cooling liquid (e.g., water) enters a rear door inlet port. At blocks 544 and 546, the cooling liquid from the rear door inlet port flows to both the heat exchanger coil and rack manifold supply port. At block 548, cooling liquid from the rack manifold supply port flows through the server cooling loop. At block 550, cooling liquid from the server cooling loop returns to the rack manifold and exits the rear door outlet port 552. The cooling liquid from heat exchanger coil 344 also exits the rear door outlet port at block 552.

For this design implementation, as described in FIG. 5C, cooling liquid enters the heat exchanger coil and the rack manifold in parallel such that heat exchange cooling and server loop cooling can take place together instead of sequentially. The design implementations as disclosed in FIGS. 5A-5C can be used for different use cases and operating parameters to achieve any desired solution. Depending on operating requirements such as fluid or water temperature and flow rate, any of the design implementations can be used accordingly.

Deploying, Testing and Commissioning Rear Door Solutions

Figure 6:
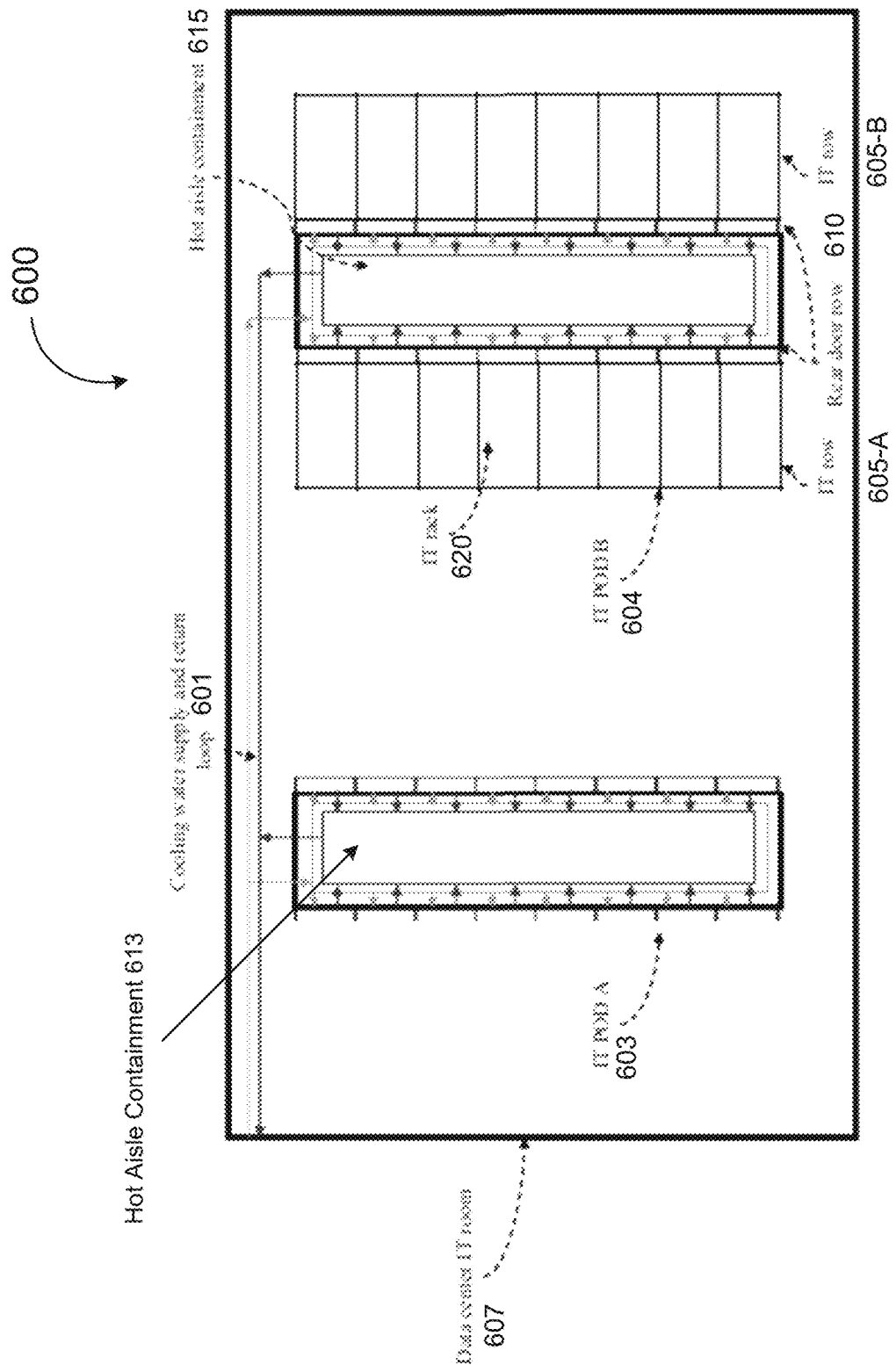
FIG. 6 illustrates a diagram for a method to deploy a hybrid multi-function rear door solution as described in FIGS. 1-5C in a data center according to one embodiment.

FIG. 6 illustrates a diagram 600 for deploying a hybrid multi-function rear door solution as described in FIGS. 1-5C in a data center IT room 607 according to one embodiment. Referring to FIG. 6, within data center IT room 607, two hot aisles are shown with reference to IT pod A 603 and IT pod B 604. Both IT pod A 603 and IT pod B 604 are coupled to cooling water supply and return loop 601. For one embodiment, cooling water supply and return loop 601 is coupled to a cooling distribution unit (CDU) as a cooling liquid source.

For one embodiment, IT pod A 603 is populated with rear doors having a combined heat exchanger and rack manifold including hot aisle containment 613. The IT pod B 604 is populated with IT rack 620 in IT rows 605-A and 605-B and rear door row 610 having combined heat exchangers and rack manifolds and within the rear door row 610 includes hot aisle containment 615. For one embodiment, hot aisle containment 615 can be a partial containment or hot aisle frame. For this example, rear doors of IT pod A 603 and IT pod B 604 are connected to receive and distribute cooling water by way of cooling water supply and return loop 601. For one example, the rear doors of IT pod A 603 and IT pod B 604 can be considered a facility unit and can be pre-deployed at a data center before IT racks with servers are populated. If considered a facility unit, rear doors of IT pod A 603 and IT pod 604 can be either designed or deployed independently or combined with hot aisle containment 613 or hot aisle frame or hot aisle containment 615 or hot aisle frame or just combined with a hot aisle frame as one module or unit, which can significantly improve design, deployment and efficiency at a data center. For one embodiment, when IT racks 620 are installed regarding IT pod B 604, the cooling water and return loop 601 connected to the IT rack 620 can be designed according to different methods and techniques.

Figure 7:
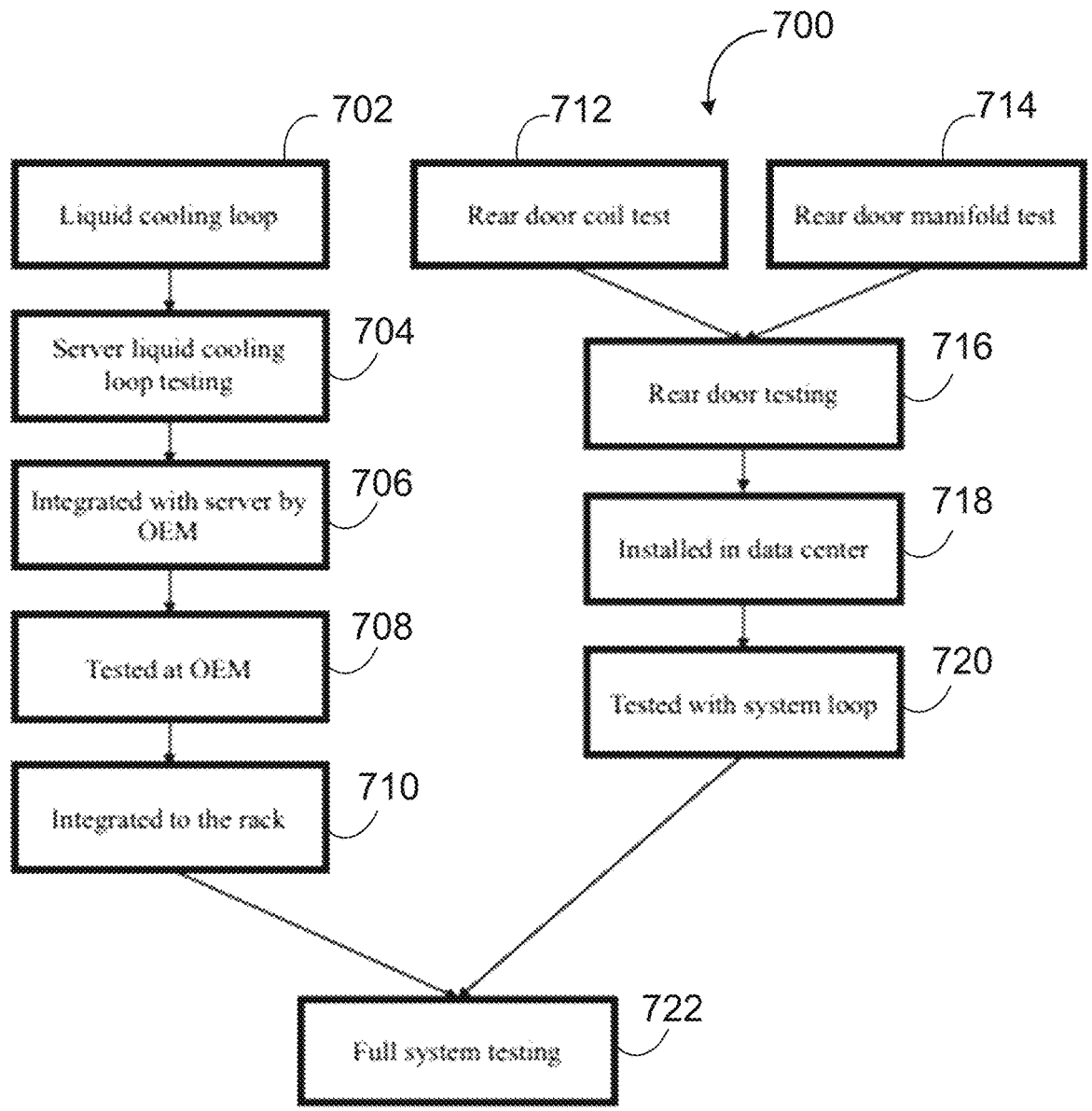
FIG. 7 illustrates a flow diagram for a method of testing and commissioning a hybrid multi-function rear door solution as described in FIGS. 1-5C in a data center according to one embodiment.

FIG. 7 illustrates a flow diagram for a method 700 of testing and commissioning a hybrid multi-function rear door solution as described in FIGS. 1-5C according to one embodiment. For one embodiment, the rear door having an integrated heat exchanger and rack manifold can be a facility unit and tested at the facility side or data center such as testing pressurization. In this way, the rear doors can be designed, manufactured and tested together at the facility side or data center. Having such testing performed at the facility side can improve deployment efficiency and reliability, and also corresponding cost. For method 700, the server and rack vendor need only test the server liquid cooling loop and no rack level testing is needed before being deployed at the data center.

Referring to FIG. 7, for one embodiment, method 700 includes two testing paths. Along the first path, at block 702, the liquid cooling loop is initiated. At block 704, the server liquid cooling loop is tested. At block 706, the liquid cooling loop is integrated with the server and original equipment manufacturer OEM. At block 708, the liquid cooling server level products are tested in OEM. At block 710, the servers are integrated into the rack. For blocks 702-710, the operations performed within the rack including liquid cooling, loop manufacturing, testing, assembly to the server, server level testing, and integration to the rack. At block 722, full system testing is performed.

For one embodiment, along the second path, at blocks 712 and 714, the rear door coil is tested and the rear door manifold is tested. At block 716, the rear door is tested. At block 718, only the rear door need be installed at the data center. For example, the rear door can be physically attached to the hot aisle containment or hot aisle frame. At block 720, the rear door including the heat exchanger coil and manifold and system loop is tested, which leads to block 722 for full system testing.

For the above method, the rear door can be designed as a dependent and combined unit—i.e., rack manifold and heat exchanger—or a combined unit with the containment. For one embodiment, each IT rack is aligned with its corresponding rear door and each server is individually connected to the manifold even in the case where the rack is fully deployed with populated servers.

Figure 8:
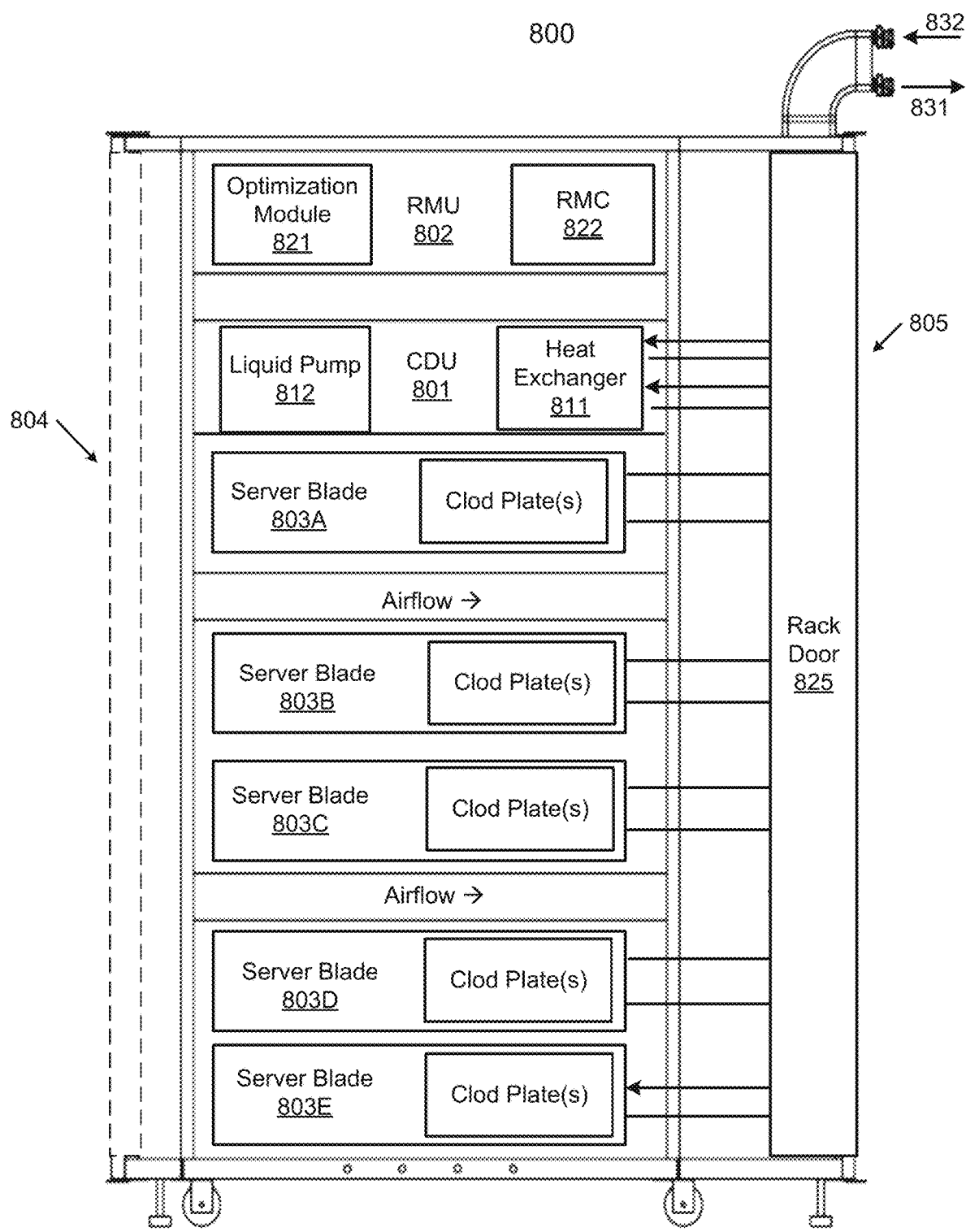
FIG. 8 is a block diagram illustrating an example of an electronic rack according to one embodiment.

FIG. 8 is block diagram illustrating an electronic rack according to one embodiment. Electronic rack 800 may represent the electronic rack as shown in FIG. 1. Referring to FIG. 8, according to one embodiment, electronic rack 800 includes, but is not limited to, optional CDU 801, optional RMU 802, and one or more server blades 803A-803E (collectively referred to as server blades 803). Server blades 803 can be inserted into an array of server slots respectively from frontend 804 of electronic rack 800. Note that although there are five server blades 803A-803E shown here, more or fewer server blades may be maintained within electronic rack 800. Also note that the particular positions of CDU 801, RMU 802, and server blades 803 are shown for the purpose of illustration only; other arrangements or configurations of CDU 801, RMU 802, and server blades 803 may also be implemented. In one embodiment, electronic rack 800 can be either open to the environment or partially contained by a rack container, as long as the cooling fans can generate airflows from frontend 804 to backend 805.

In addition, for at least some of the server blades 803, an optional fan module (not shown) is associated with the server blade. Each of the fan modules includes one or more cooling fans. The fan modules may be mounted on the backends of server blades 203 or on the electronic rack to generate airflows flowing from frontend 804, traveling through the air space of the sever blades 803, and existing at backend 205 of electronic rack 800.

In one embodiment, optional CDU 801 mainly includes heat exchanger 811, liquid pump 812, and a pump controller (not shown), and some other components such as a liquid reservoir, a power supply, monitoring sensors and so on. Heat exchanger 811 may be a liquid-to-liquid heat exchanger. Heat exchanger 811 includes a first loop with inlet and outlet ports having a first pair of liquid connectors coupled to external liquid supply/return lines 831-832 to form a primary loop. The connectors coupled to the external liquid supply/return lines 831-832 may be disposed or mounted on backend 805 of electronic rack 800. The liquid supply/return lines 831-832, also referred to as room liquid supply/return lines, are coupled to an external cooling liquid source. In addition, heat exchanger 811 further includes a second loop with two ports having a second pair of liquid connectors coupled to a liquid manifold integrated within rack door 825 to form a secondary loop, which may include a supply manifold (also referred to as a rack liquid supply line) to supply cooling liquid to server blades 803 and a return manifold (also referred to as a rack liquid return line) to return warmer liquid back to CDU 801. Note that CDUs 801 can be any kind of CDUs commercially available or customized ones. Thus, the details of CDUs 801 will not be described herein.

Each of server blades 803 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 803 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 800 further includes optional RMU 802 configured to provide and manage power supplied to servers 803, and CDU 801. RMU 802 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 800.

In one embodiment, RMU 802 includes optimization module 821 and rack management controller (RMC) 822. RMC 822 may include a monitor to monitor operating status of various components within electronic rack 800, such as, for example, computing nodes 803, CDU 801, and fan modules (not shown). Specifically, the monitor receives operating data from various sensors representing the operating environments of electronic rack 800. For example, the monitor may receive operating data representing temperatures of the processors, cooling liquid, and airflows, which may be captured and collected via various temperature sensors. The monitor may also receive data representing the fan power and pump power generated by the fan modules and liquid pump 812, which may be proportional to their respective speeds. These operating data are referred to as real-time operating data. Note that the monitor may be implemented as a separate module within RMU 802.

Based on the operating data, optimization module 821 performs an optimization using a predetermined optimization function or optimization model to derive a set of optimal fan speeds for the fan modules and an optimal pump speed for liquid pump 812, such that the total power consumption of liquid pump 812 and the fan modules reaches minimum, while the operating data associated with liquid pump 812 and cooling fans of the fan modules are within their respective designed specifications. Once the optimal pump speed and optimal fan speeds have been determined, RMC 822 configures liquid pump 812 and cooling fans of the fan modules based on the optimal pump speeds and fan speeds.

In one embodiment, rack door 825 can be any of rack doors described through this application. Rack door 825 includes a rack manifold coupled to lines 831-832 and a heat exchanger (e.g., an air-to-liquid heat exchanger) integrated therein, as described above. The rack manifold includes an array of pairs of supply ports and return ports coupled to server blades 803.

In the foregoing specification, embodiments and examples of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An electronic rack, comprising:
   a rack frame to house a plurality of server slots to receive a plurality of server blades from a frontend of the housing, each of the server blades containing one or more servers, wherein each server having one or more processors each being mounted on a cold plate; and
   a rack door coupled to a backend of the rack frame, wherein the rack door includes:
      an inlet port to receive cooling liquid from an external cooling liquid source,
      an outlet port to return the cooling liquid to the external cooling liquid source
      a rack manifold coupled to the inlet port to receive the cooling liquid from the external cooling liquid source and to supply the cooling liquid to the cold plates of the server blades, and
      a heat exchanger to exchange heat carried by air flowing from the server blades using the cooling liquid, wherein the inlet port, outlet port, and the manifold are mounted on a first section of the rack door, while the heat exchanger is mounted on a second section of the rack door, wherein the first section of the rack door is fixed mounted on the backend of the rack frame, while the second section of the rack door can swing open and closed with respect to the first section.

2. The electronic rack of claim 1, wherein the heat exchanger is an air-to-liquid heat exchanger.

3. The electronic rack of claim 1, wherein the cooling liquid received from the inlet port enters the heat exchanger, then enters the rack manifold, then enters server cooling loops of the server blades, then exits the server blades and back to the rack manifold, and then returns back to the external cooling liquid source via the outlet port.

4. The electronic rack of claim 1, wherein the cooling liquid received from the inlet port enters the rack manifold first, then enters server cooling loops of server blades, then exist the server blades back to the rack manifold, then enters the heat exchanger, and then returns back to the external cooling liquid source.

5. The electronic rack of claim 1, wherein the cooling liquid received from the inlet port enters the heat exchanger and the rack manifold in parallel.

6. The electronic rack of claim 1, wherein the rack manifold comprises a plurality of pairs of supply ports and return ports, each of the pairs to be coupled to one of the server blades.

7. The electronic rack of claim 6, wherein for each of the server blades, a corresponding supply port of the manifold is to supply cooling liquid to the cold plates of the server blade to exchange heat from the cold plates, and wherein a corresponding return port is to receive the cooling liquid carrying the exchanged heat from the cold plates of the server blades.

8. The electronic rack of claim 6, wherein each of the pairs of supply ports and return ports of the manifold are to be coupled to an inlet end and an outlet end of a server cooling loop of a corresponding server blade.

9. The electronic rack of claim 8, wherein each pair of the support port and return port of the manifold is coupled to a corresponding pair of inlet end and outlet end of a corresponding server cooling loop via dripless blind mate connectors.

10. The electronic rack of claim 9, wherein when a server blade is inserted into a server slot, the inlet end and the outlet end of a corresponding server cooling loop are engaged with the corresponding support port and return port of the manifold via corresponding dripless blind mate connectors.

11. A rack door for an electronic rack, comprising:
    an inlet port to receive cooling liquid from an external cooling liquid source;
    an outlet port to return the cooling liquid to the external cooling liquid source
    a rack manifold coupled to the inlet port to receive the cooling liquid from the external cooling liquid source and to supply the cooling liquid to cold plates of a plurality of server blades inserted into a plurality of server slots of an electronic rack from a frontend of the electronic rack, wherein each server having one or more processors each being mounted on one of the cold plates; and
    a heat exchanger to exchange heat carried by air flowing from the server blades using the cooling liquid, wherein the rack door is to be mounted on a backend of the electronic rack.

12. The rack door of claim 11, wherein the heat exchanger is an air-to-liquid heat exchanger.

13. The rack door of claim 11, wherein the cooling liquid received from the inlet port enters the heat exchanger, then enters the rack manifold, then enters server cooling loops of the server blades, then exits the server blades and back to the rack manifold, and then returns back to the external cooling liquid source via the outlet port.

14. The rack door of claim 11, wherein the cooling liquid received from the inlet port enters the rack manifold first, then enters server cooling loops of server blades, then exist the server blades back to the rack manifold, then enters the heat exchanger, and then returns back to the external cooling liquid source.

15. The rack door of claim 11, wherein the cooling liquid received from the inlet port enters the heat exchanger and the rack manifold in parallel.

16. The rack door of claim 11, wherein the rack manifold comprises a plurality of pairs of supply ports and return ports, each of the pairs to be coupled to one of the server blades.

17. The rack door of claim 16, wherein for each of the server blades, a corresponding supply port of the manifold is to supply cooling liquid to the cold plates of the server blade to exchange heat from the cold plates, and wherein a corresponding return port is to receive the cooling liquid carrying the exchanged heat from the cold plates of the server blades.

18. The rack door of claim 16, wherein each of the pairs of supply ports and return ports of the manifold are to be coupled to an inlet end and an outlet end of a server cooling loop of a corresponding server blade.

\* \* \* \* \*